(12) United States Patent
Choi

(10) Patent No.: US 7,767,477 B2
(45) Date of Patent: *Aug. 3, 2010

(54) METHOD OF MANUFACTURING A THIN FILM TRANSISTOR ARRAY PANEL

(75) Inventor: Tae-Young Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 254 days.

This patent is subject to a terminal disclaimer.

(21) Appl. No.: 11/969,386

(22) Filed: Jan. 4, 2008

(65) Prior Publication Data

US 2008/0131985 A1      Jun. 5, 2008

Related U.S. Application Data

(63) Continuation of application No. 11/369,534, filed on Mar. 7, 2006, now Pat. No. 7,335,524.

(30) Foreign Application Priority Data

Mar. 29, 2005  (KR)  .................... 10-2005-0026015

(51) Int. Cl.
   *H01L 21/00*   (2006.01)
(52) U.S. Cl. .................. 438/30; 438/942; 257/E21.024
(58) Field of Classification Search .................. 438/30, 438/942, 943, 944, 945
   See application file for complete search history.

(56) References Cited

U.S. PATENT DOCUMENTS 6,489,176 B2    12/2002  Ninomiya
6,891,231 B2    5/2005   Bojarczuk, Jr. et al.
7,335,524 B2 *  2/2008   Choi .......................... 438/30
2004/0036830 A1 2/2004   Murai
2004/0056251 A1 3/2004   Kim et al.
2005/0250270 A1 11/2005  Wu et al.

FOREIGN PATENT DOCUMENTS

| JP | 62177526 A | 8/1987 |
| JP | 2000284303 | 10/2000 |
| JP | 2001272929 | 10/2001 |
| JP | 2002040452 | 2/2002 |
| JP | 2002268084 | 9/2002 |
| JP | 2003114421 | 4/2003 |
| JP | 2003177551 | 6/2003 |
| JP | 2003295170 | 10/2003 |
| KR | 1020040015806 | 2/2004 |
| KR | 100442413 | 7/2004 |
| KR | 100449432 | 9/2004 |

* cited by examiner

*Primary Examiner*—Walter L Lindsay, Jr.
*Assistant Examiner*—Reema Patel
(74) *Attorney, Agent, or Firm*—Cantor Colburn LLP

(57) ABSTRACT

A method for manufacturing a flexible display, includes forming a gate line including a plurality of gate electrodes with a first interval on a substrate having a coefficient of thermal expansion, sequentially depositing both a gate insulating layer covering the gate line and a semiconductor layer, etching the semiconductor layer by using a mask having a plurality of semiconductor patterns with a second interval different from the first interval to form a semiconductor, forming both a data line including a source electrode and a drain electrode on the semiconductor and the gate insulating layer, and forming a pixel electrode coupled with the drain electrode.

19 Claims, 19 Drawing Sheets

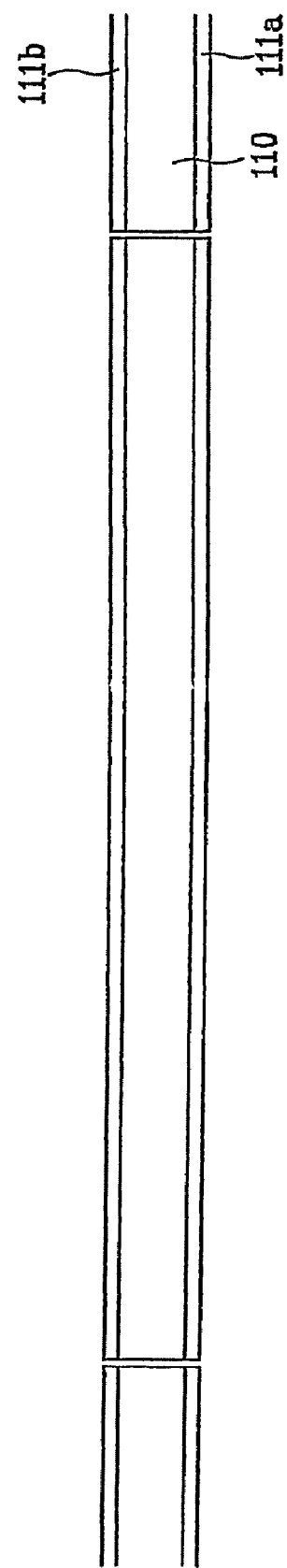

METHOD OF MANUFACTURING A THIN FILM TRANSISTOR ARRAY PANEL

CROSS REFERENCE TO RELATED APPLICATION

This application is a continuation application of U.S. application Ser. No. 11/369,534 filed Mar. 7, 2006, which claims priority to and the benefit of Korean Patent Application No. 10-2005-0026015, filed on Mar. 29, 2005, which is hereby incorporated by reference for all purposes as if fully set forth herein.

BACKGROUND OF THE INVENTION

1. Field of the Invention

The present invention relates to a method for manufacturing a thin film transistor array panel, and more particularly to a method for manufacturing a thin film transistor array panel including a plastic substrate.

2. Description of the Related Art

A liquid crystal display (LCD) and an organic light emitting display (OLED) are common types of flat panel displays.

An LCD includes two panels provided with field-generating electrodes such as pixel electrodes and a common electrode and polarizers, and a liquid crystal (LC) layer arranged therebetween. Voltages are applied to the field-generating electrodes to generate an electric field in the LC layer. The electric field determines orientations of LC molecules in the LC layer to adjust polarization of incident light for displaying an image.

An organic light emitting display (OLED) is a self-emissive display device, which displays images by exciting an emissive organic material to emit light. The OLED includes an anode (hole injection electrode), a cathode (electron injection electrode), and an organic light emission layer arranged therebetween. When holes and electrons are injected into the light emission layer, they are recombined and annihilated while emitting light.

However, because the liquid crystal display and the organic light emitting display include a fragile and relatively heavy glass substrate, they are not suitable for portable and large scale displays.

Accordingly, a display device using a flexible substrate such as plastic, which is relatively light and strong, is being used.

When the plastic substrate is used instead of the glass substrate, the LCD is more portable, stable, and has a lighter weight. A deposition process and a printing process may be used to form the flexile display, and the flexible display using the plastic substrate may be manufactured by a roll-to-roll process. Accordingly, mass production is possible, which reduces production cost.

However, problems arise because the plastic substrate expands during the manufacturing process due to the high temperature since a weak heat resistant property of the plastic substrate results in a misalignment of the thin film patterns.

SUMMARY OF THE INVENTION

The present provides a method for manufacturing a thin film transistor array panel that includes a plastic substrate that prevents misalignment of the gate lines due to heat generated during the manufacturing process.

Additional features of the invention will be set forth in the description which follows, and in part will be apparent from the description, or may be learned by practice of the invention.

The present invention discloses a method of manufacturing a display, the method including forming a gate line having a gate electrode with a first interval on a substrate; sequentially depositing a gate insulating layer that covers the gate line and a semiconductor layer; forming a semiconductor by etching the semiconductor layer with a mask, to form a second interval that is different from the first interval; forming a data line, a source electrode, and a drain electrode and the gate insulating layer; and forming a pixel electrode coupled with the drain electrode.

The present invention also discloses a method of forming gate patterns on a substrate, including forming a gate mask having a predetermined distance between two center portions of adjacent gate electrodes to be formed on the substrate; depositing a gate insulating layer and a semiconductor layer on the substrate; and forming a semiconductor mask with semiconductor patterns being spaced apart from each other at a distance that is equal to the predetermined distance plus a distance relating to the coefficient of thermal expansion of the substrate, wherein the center portions of the adjacent gate electrodes correspond with the center portions of the adjacent semiconductor patterns due to the thermal expansion.

It is to be understood that both the foregoing general description and the following detailed description are exemplary and explanatory and are intended to provide further explanation of the invention as claimed

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIG. 3 is a cross-sectional view of a TFT array panel shown in FIG. 1 and FIG. 2 during a first operation of a manufacturing method thereof according to an embodiment of the invention.

DESCRIPTION OF THE ILLUSTRATED EMBODIMENTS

Figure 1:
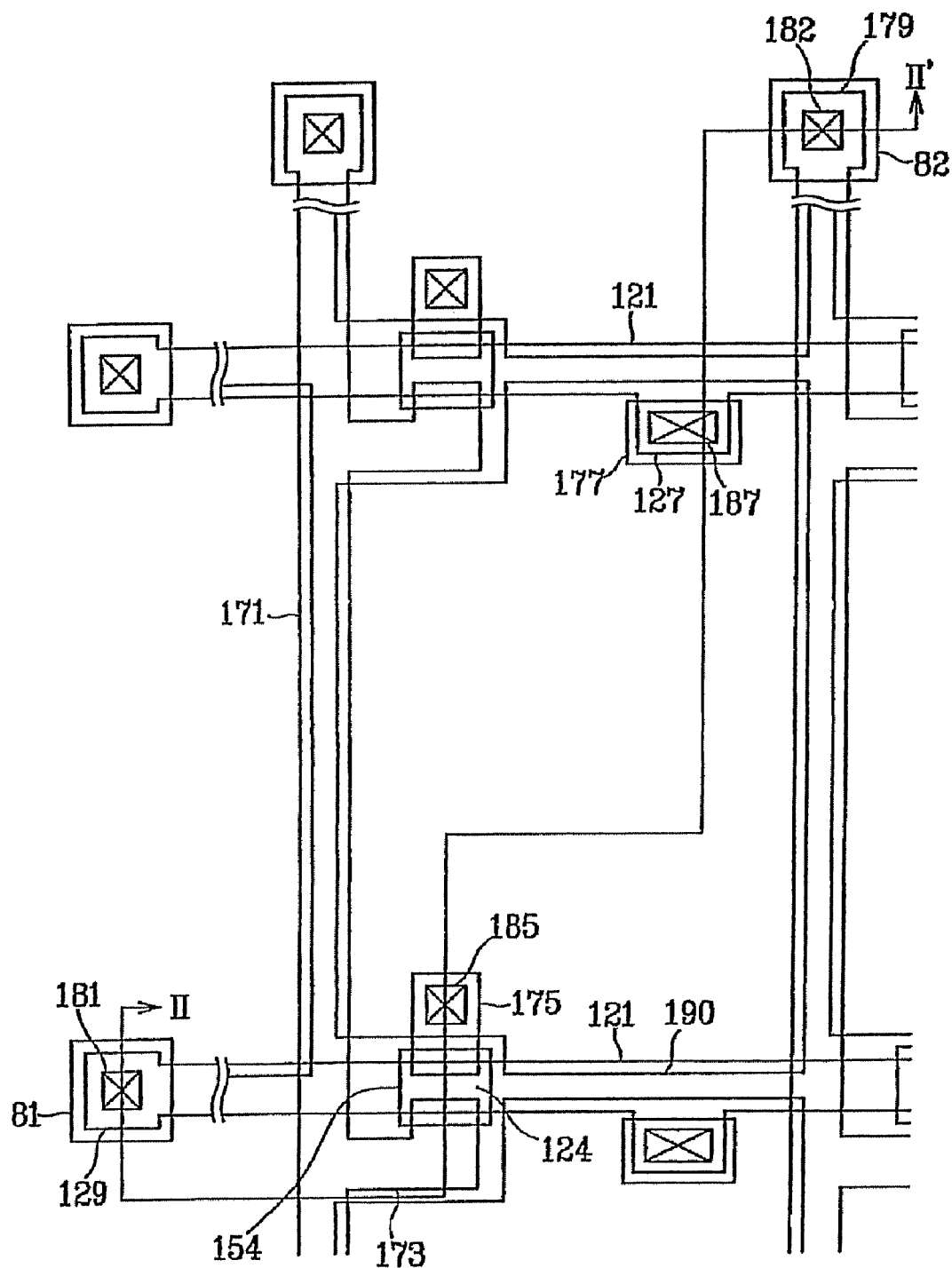
FIG. 1 is a layout view of a TFT array panel for an LCD according to an embodiment of the invention.

The present invention is described below more fully with reference to the accompanying drawings, in which preferred embodiments of the invention are shown. The present invention may, however, be embodied in many different forms and should not be construed as limited to the embodiments set forth herein.

In the drawings, the thickness of layers, films, and regions are exaggerated for clarity. Like numerals refer to like elements throughout. It will be understood that when an element such as a layer, film, region, or substrate is referred to as being "on" another element, the element may be directly on the other element or intervening elements may also be present. In contrast, when an element is referred to as being "directly on" another element, there are no intervening elements present.

A TFT array panel is described below with reference FIG. 1 and FIG. 2.

FIG. 1 is a layout view of a TFT array panel for an LCD according to an embodiment of the invention. FIG. 2 is a sectional view of the TFT array panel shown in FIG. 1 taken along the lines II-II'.

An insulating substrate 110, which may be made of a plastic material, is provided, and lower and upper barrier layers 111a and 111b, which are made of an inorganic material such as $SiO_2$ and $SiN_x$ or an organic material, are respectively formed on the surfaces of the plastic substrate 110.

The plastic substrate includes a layer made of at least one material selected from polyacrylate, polyethylene-terephthalate, polyethylene-naphthalate, polycarbonate, polyarylate, polyether-imide, polyethersulfone, and polyimides, or has a multi-layered structure including the layer.

The lower barrier layer 111a and the upper barrier layer 111b prevent or substantially prevent oxygen or moisture from penetrating the plastic substrate 110. It is preferable that both the lower barrier layer 111a and the upper barrier layer 111b are arranged thereon, however, one or both of the lower barrier layer 111a and the upper barrier layer 111b may be omitted.

A plurality of gate lines 121 are arranged on the upper barrier layer 111b.

The gate lines 121 extend substantially in a transverse direction and are separated from each other and transmit gate signals. Each gate line 121 includes a plurality of portions forming a plurality of gate electrodes 124, a plurality of projections 127 extending there from; e.g., in a downward direction, and an end portion 129 having a sufficiently large area for contact with another layer or an external driving circuit. The gate lines 121 may connect; e.g., couple, with a driving circuit that may be integrated on the insulating substrate 110.

The gate lines 121 include two films having different physical characteristics, i.e., a lower film and an upper film. The lower film may be made of a low resistivity metal including an containing metal such as Al and an Al alloy for reducing signal delay or voltage drop in the gate lines 121. The upper film may be made of a material such as Cr, Mo, or a Mo alloy, which has relatively good contact characteristics with other materials such as indium zinc oxide (IZO). For example, the upper film material may be Mo or a Mo alloy and the lower film material may be an Al or an Al alloy. In FIG. 2, the TFT array panel includes the lower film 124p and the upper film 124q of the gate electrodes 124, the lower film 129p and the upper film 129q of the end positions 129, and the projections 127 include the lower film 127p and the upper film 127q of the projections 127.

The lateral sides of the upper film and the lower film are tapered, and the inclination angle of the lateral sides with respect to a surface of the substrate 110 ranges from about 30 to about 80 degrees.

A gate insulating layer 140, which may be made of silicon nitride ($SiN_x$), is arranged on the gate lines 121.

A plurality of semiconductor islands 154, which may be made of hydrogenated amorphous silicon (abbreviated to "a-Si") or polysilicon, are arranged on the gate insulating layer 140.

A plurality of ohmic contact islands 163 and 165 preferably made of silicide or n+ hydrogenated a-Si heavily doped with n-type impurities are formed on the semiconductor islands 154. Pairs of an ohmic contact 163 and an ohmic contact 165 are located on the semiconductor islands 154.

The lateral sides of the semiconductor islands 154 and the ohmic contacts 163 and 165 are tapered, and the inclination angles thereof are preferably in a range between about 30-80 degrees.

A plurality of data lines 171, a plurality of drain electrodes 175, and a plurality of storage capacitor conductors 177 are formed on the ohmic contacts 163 and 165 and the gate insulating layer 140.

The data lines 171 for transmitting data voltages extend substantially in the longitudinal direction and intersect the gate lines 121. Each data line 171 includes an end portion 179 having a larger area for contact with another layer or an external device.

A plurality of branches of each data line 171, which project toward the drain electrodes 175, form a plurality of source electrodes 173. Each pair of the source electrodes 173 and the drain electrodes 175 are separated from each other and are opposite each other with respect to a gate electrode 124. A gate electrode 124, a source electrode 173, a drain electrode 175, and the semiconductor islands form a TFT having a channel formed in the semiconductor islands 154 disposed between the source electrode 173 and the drain electrode 175.

The storage capacitor conductors 177 overlap the projections 127 of the gate lines 121.

The data lines 171 and the drain electrodes 175 may be made of a metal such as Al, Cr, Mo, Ti, Ta, or an alloy thereof. The data lines 171 and the drain electrodes 175 may be a single-layered or multi-layered structure. For example, for a three-layered structure, the data line 171, the drain electrode 175, and the storage capacitor conductor 177 have first layers 171p, 175p, and 177p, second layers 171q, 175q, and 177q, and third layers 171r, 175r, and 177r. The first layers 171p, 175p, and 177p and the third layers 171r, 175r, and 177r are respectively disposed at lower and upper sides of the second layers 171q, 175q, and 177q. The first layers 171p, 175p, and 177p have relatively good contact characteristics with the underlying layer and block diffusion into the silicon layer of the semiconductor. The third layers 171r, 175r, and 177r have relatively good contact characteristics with ITO (indium tin oxide) or IZO. The second layers 171q, 175q, and 177q may be made of an containing metal, and the first layers 171p, 175p, and 177p and the third layers 171r, 175r, and 177r may be made of a molybdenum alloy (Mo-alloy).

Similar to the gate lines 121, the data lines 171 and the drain electrodes 175 have tapered lateral sides, and the inclination angles thereof range about 30 to about 80 degrees.

The ohmic contacts 163 and 165 are only arranged between the underlying semiconductor islands 154 and the overlying source electrode 173 and the overlying drain electrodes 175 thereon, and reduce the contact resistance therebetween. The semiconductor islands 154 include a plurality of exposed portions, which are not covered with the data lines 171 and the drain electrodes 175, such as portions positioned between the source electrodes 173 and the drain electrodes 175.

A lower passivation layer 180p, which may be made of an inorganic material such as silicon nitride or silicon oxide, is arranged on the data lines 171, the drain electrodes 175, the storage capacitor conductors 177, and the exposed portions of the semiconductor islands 154. An upper passivation layer 180q is formed on the lower passivation layer 180p. The upper passivation layer 180q may be made of a photosensitive organic material having a good flatness characteristic. The lower passivation layer 180p is preferably about 500 Å to about 2,000 Å thick, and the upper passivation layer 180q is in the range of about 2 to about 3.5 microns thick. The upper passivation layer may be made of an organic material to minimize cross-talk by counterbalancing misalignment between the data lines 171, the drain electrodes 175, the storage capacitor conductors 177, and an overlying layer.

The lower passivation layer 180p or the upper passivation layer 180q may be omitted.

The lower passivation layer 180p and the upper passivation layer 180q have a plurality of contact holes 182, 185, and 187 exposing the end portions 179 of the data lines 171, the drain electrodes 175, and the storage capacitor conductors 177, respectively. The lower passivation layer 180p, the upper passivation layer 180q, and the gate insulating layer 140 have a plurality of contact holes 181 exposing end portions 129 of the gate lines 121.

A plurality of pixel electrodes 190 and a plurality of contact assistants 81 and 82, which may be made of IZO or ITO, are arranged on the upper passivation layer 180q.

The pixel electrodes 190 are physically and electrically connected, e.g., coupled, with the drain electrodes 175 through the contact holes 185 and to the storage capacitor conductors 177 through the contact holes 187 so that the pixel electrodes 190 receive the data voltages from the drain electrodes 175 and transmit the received data voltages to the storage capacitor conductors 177.

The pixel electrodes 190 supplied with the data voltages generate electric fields in cooperation with a common electrode (not shown) on another panel (not shown), which reorients liquid crystal molecules in a liquid crystal layer disposed therebetween.

The contact assistants 81 and 82 are connected to the exposed end portions 129 of the gate lines 121 and the exposed end portions 179 of the data lines 171 through the contact holes 181 and 182, respectively. The contact assistants 81 and 82 are not required; however, they protect the exposed portions 129 and 179 and improve the adhesiveness between the exposed portion 129 and 179 and external devices.

A method for manufacturing the TFT array panel shown in FIG. 1 and FIG. 2 according to an embodiment of the invention is described below with reference to FIGS. 3, 4A, 4B, 5, 6A, 6B, 7, 8A, and 8B.

Figure 2:
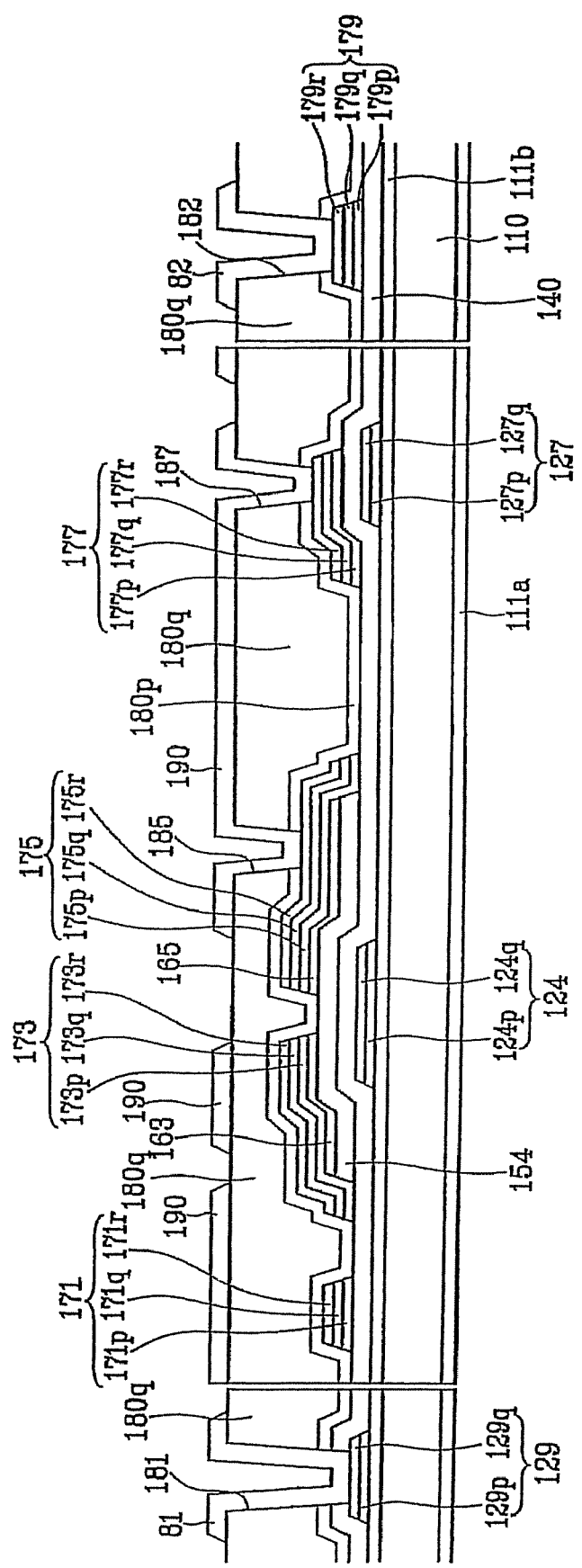
FIG. 2 is a sectional view of the TFT array panel shown in FIG. 1 taken along the lines II-II'.

FIG. 3 is a cross-sectional view of a TFT array panel shown in FIG. 1 and FIG. 2 in the first operation of a manufacturing method thereof according to an embodiment of the invention Referring to FIG. 3, an insulating substrate 110, such as a plastic substrate, is provided.

The substrate 110 includes a layer made of a material selected from polyacrylate, polyethylene-terephthalate, polyethylene-naphthalate, polycarbonate, polyarylate, polyether- imide, polyethersulfone, and polyimides, or may be a multi-layered structure including the layer.

A lower barrier layer 111a and an upper barrier layer 111b are respectively formed on surfaces of the plastic substrate 110. An inorganic material, such as $SiO_2$ or $SiN_x$, is deposited by a CVD (chemical vapor deposition) process to form the lower barrier layer 111a and the upper barrier layer 111b. It is understood that the lower barrier layer 111a and/or the upper barrier layer 111b may be omitted. The lower barrier layer 111a and the upper barrier layer 111b assist in preventing oxygen or moisture from penetrating the plastic substrate 110.

Figure 4A:
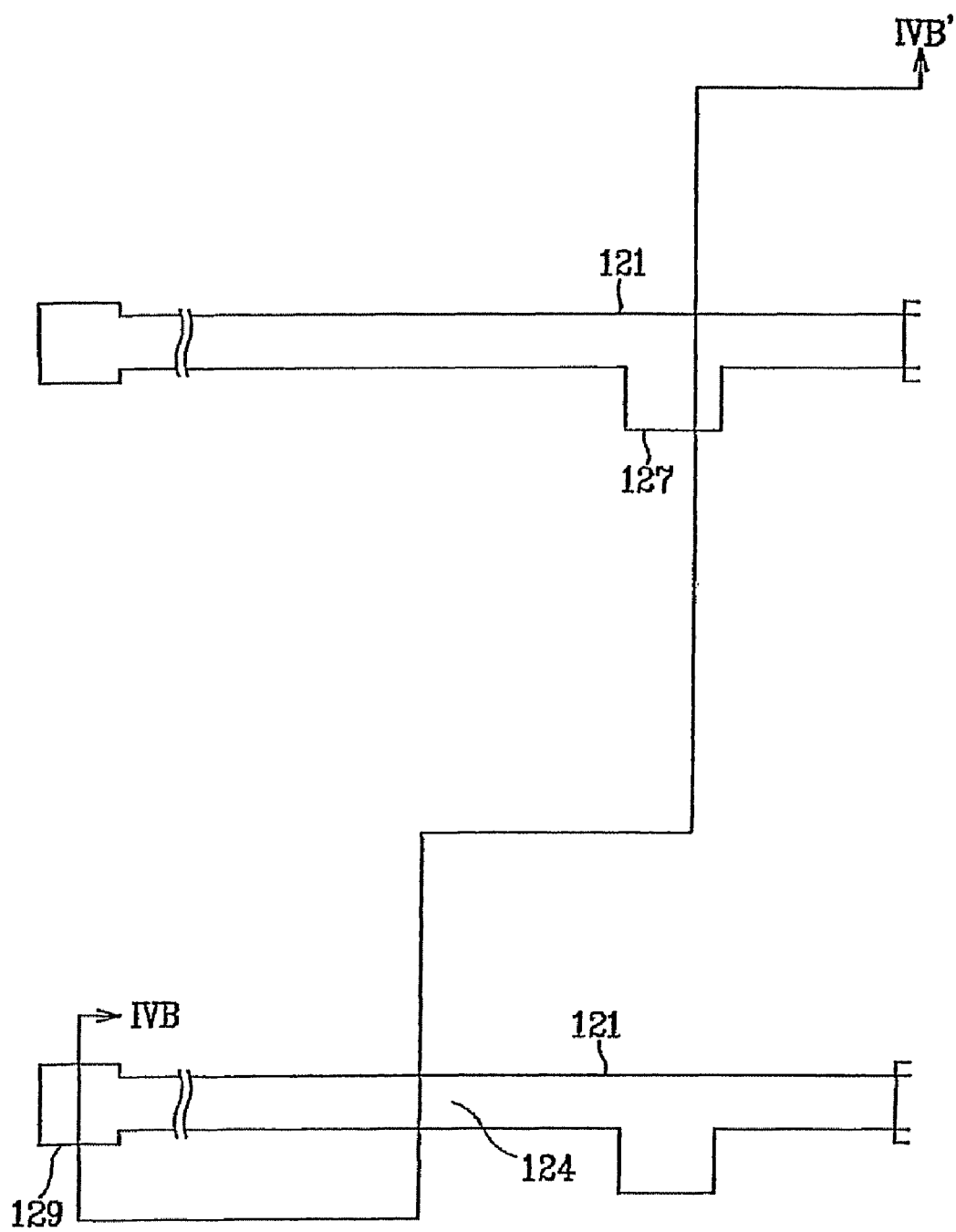
FIGS. 4A, 6A, 7A, and 8A are layout views of a TFT array panel shown in FIG. 1 and FIG. 2 in intermediate operation of a manufacturing method thereof according to an embodiment of the invention.
Figure 4B:
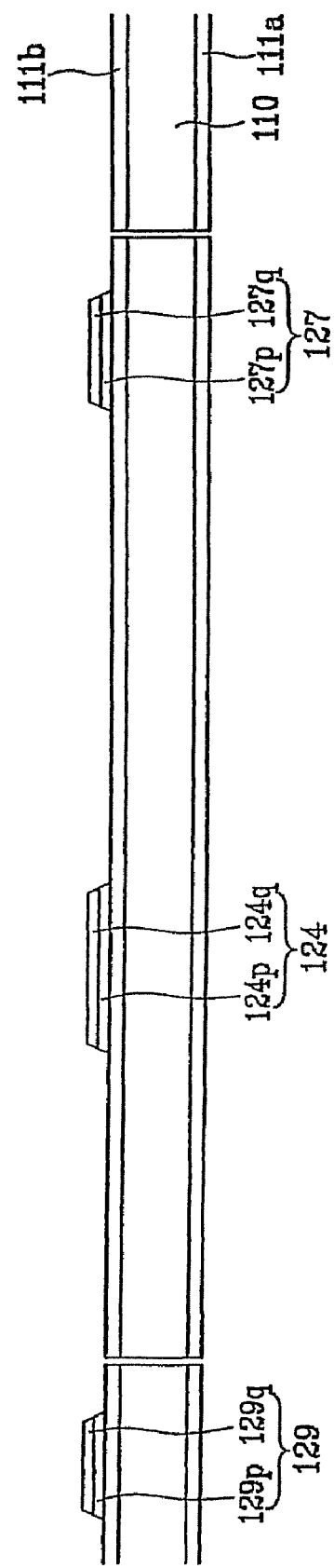
FIG. 4B is a sectional view of the TFT array panel shown in FIG. 4A taken along the line IVB-IVB'.

As shown in FIGS. 4a and 4b, a metal film is sputtered and patterned by a photo-etching process with a photoresist pattern on the plastic substrate 110 to form a plurality of gate lines 121 that include a plurality of gate electrodes 124, a plurality of projections 127, and a plurality of end portions 129.

The gate lines 121 may be a single layer or a multi-layer structure. For example, as shown in FIG. 4A and FIG. 4B, the gate lines 121 may include two films having different physical characteristics, i.e., a lower film and an upper film. The lower film may be made of Al or an Al—Nd alloy including a predetermined amount of Nd, and the upper film may be made of a metal including Mo.

The upper layer and the lower layer are deposited by a co-sputtering process. The co-sputtering is performed by installing two targets in the same sputtering chamber for the co-sputtering. One target may be of Al or an Al—Nd alloy including a predetermined amount of Nd. The other target may be made of molybdenum (Mo), or a molybdenum alloy (Mo-alloy).

Power is applied to the Al (or Al—Nd) target while no power is applied to the Mo target to deposit the lower film of Al (or Al alloy). The lower layer is preferably about 2,500 Å thick.

Power is then switched to be applied to the Mo-alloy target and not to be applied to the Al (or Al alloy) target to deposit the upper film.

The upper layer and the lower layer may be etched using the same etch condition.

Figure 5:
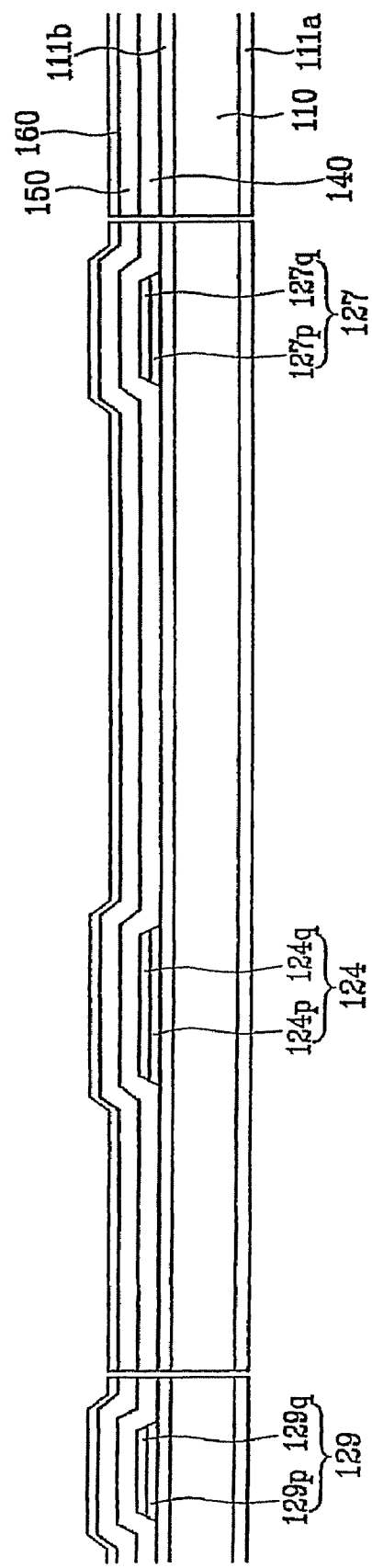
FIG. 5 is a sectional view of the TFT array panel shown in FIG. 4A taken along the line IVB-IVB', and illustrates an operation following the step shown in FIG. 4B.

Referring to FIG. 5, an inorganic material such as $SiO_2$ or $SiN_x$ is deposited by the CVD process to form a gate insulating layer 140 that covers the gate lines 121.

An intrinsic a-Si layer 150 and an extrinsic a-Si layer 160 are sequentially deposited on the gate insulating layer 140.

The gate insulating layer 140, the intrinsic a-Si layer 150, and the extrinsic a-Si layer 160 are deposited to be about 2,000 Å to about 5,000 Å thick, about 1,000 Å to about 3,500 Å thick, and about 200 Å to about 1,000 Å thick, respectively. The layers are deposited at a temperature range of about 130 to about 180° C. degrees, preferably about 150° C. degrees.

At this time, the substrate 110 formed of plastic expands due to the heat. The expansion generated differs depending on the type of plastic used for the plastic substrate 110; however, the expansion of the plastic substrate 110 occurs when the gate insulating layer 140 is deposited, the intrinsic a-Si layer 150 is deposited, and the extrinsic a-Si layer 160 is deposited, because of the relatively high coefficient of thermal expansion of the plastic material; e.g., the plastic material has a coefficient of thermal expansion of about 50 ppm/K to about 60 ppm/K.

Due to such expansion of the substrate 110, the gate line 121 including the gate electrodes 124 changes from its initial position.

At this time, when the extrinsic a-Si layer 150 and the intrinsic a-Si layer 160 are etched according to the position of the gate electrode 124, the misalignment between the extrinsic a-Si layer 150 and the intrinsic a-Si layer 160 and the gate electrode 124 increases. Accordingly, a channel of a thin film transistor cannot be formed and accurately positioned.

Figure 12A:
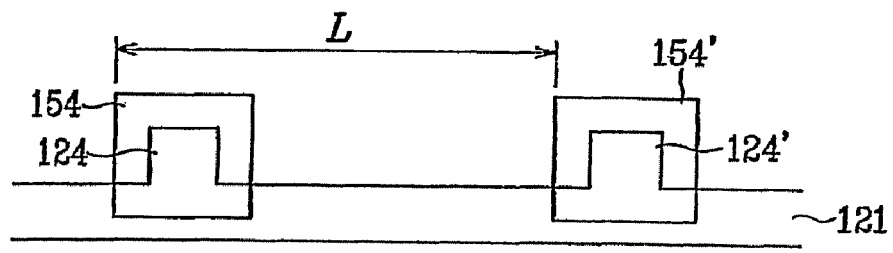
FIGS. 12A, 12B, and 12C are layout views showing the alignment between patterns according to the thermal expansion of a plastic substrate.
Figure 12B:
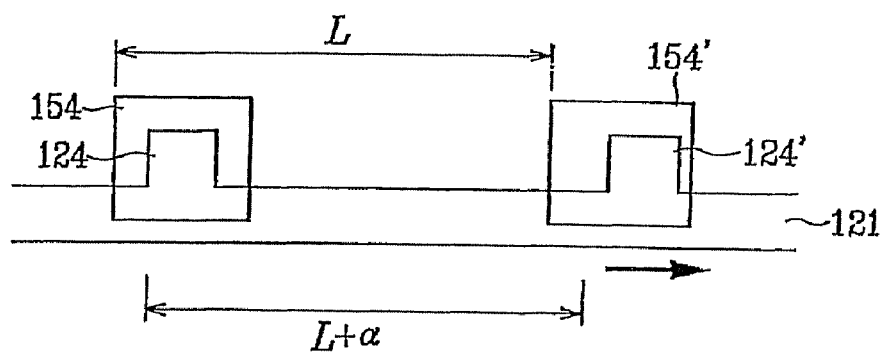
Figure 12C:
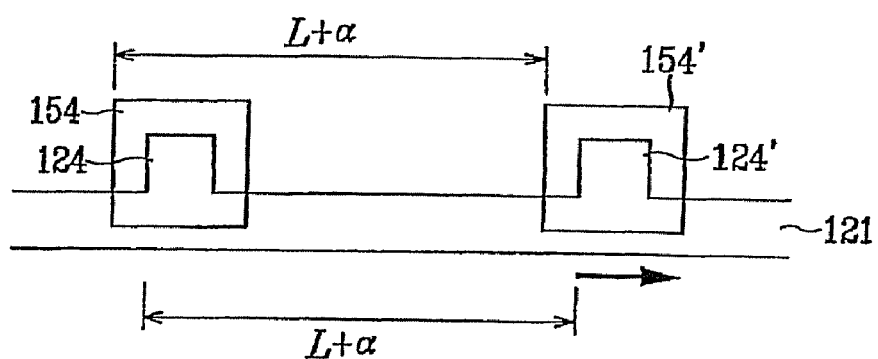

FIGS. 12A, 12B, and 12C are layout views showing alignment between the patterns according to the thermal expansion of a plastic substrate.

Referring to FIG. 12A, when a gate pattern and a semiconductor pattern are sequentially formed on a glass substrate having a minimal coefficient of thermal expansion, the neighboring gate electrodes 124 and 124' and the neighboring semiconductor patterns 154 and 154' are substantially aligned.

In detail, the gate patterns 121, 124, and 124' may be formed by using a gate mask having a distance L between two center regions of the gate electrodes 124 and 124', and the semiconductor patterns 154 and 154' are formed by using a semiconductor mask having the same distance L between two center regions of the semiconductor patterns 154 and 154' as the distance L between two center portions of the gate electrodes 124 and 124'. Since the glass substrate has a minimal coefficient of thermal expansion, the positions of the gate patterns 121, 124, and 124' and the positions of the semiconductor patterns 154 and 154' are virtually unchanged. Accordingly, the center portions of the gate electrodes 124 and 124' correspond with the center portions of the semiconductor patterns 154 and 154', respectively, and the correct alignment of the neighboring gate electrodes 124 and 124' and the neighboring semiconductor patterns 154 and 154' are completed.

However, as shown in FIG. 12B, when gate patterns and semiconductor patterns are sequentially formed on the plastic substrate having a coefficient of thermal expansion of about 40 ppm/K to about 50 ppm/K, the neighboring gate electrodes 124 and 124' and the neighboring semiconductor patterns 154 and 154' misaligned.

The gate patterns 121, 124, and 124' may be formed by using a gate mask having a distance L between two center regions of the gate electrodes 124 and 124'. A gate insulating layer and a semiconductor layer are then deposited on the plastic substrate at temperature between about 110° C. to about 180° C. Since the plastic substrate expands, the positions of the gate patterns 121, 124 and 124' change, and the distance between the two center portions of the neighboring gate electrodes 124 and 124' is L+α.

Accordingly, when the semiconductor patterns 154 and 154' are formed by using a semiconductor mask having a same distance L between two center portions of the semiconductor patterns 154 and 154' as the original distance L between two center portions of the neighboring gate electrodes, since the distance L+α between the center portions of the gate electrodes 124 and 124' does not correspond with the distance L between the center portions of the semiconductor patterns 154 and 154', a misalignment is generated between the neighboring gate electrodes 124 and 124' and the neighboring semiconductor patterns 154 and 154'.

Accordingly, the semiconductor mask having the semiconductor patterns with the interval considered by the coefficient of thermal expansion is used to form the semiconductor patterns 154 and 154' in the embodiment according to the invention.

As shown in FIG. 12C, the gate patterns 121, 124, and 124' are formed by using a gate mask having the distance L between two center portions of the gate electrodes 124 and 124'. A gate insulating layer and a semiconductor layer are then deposited on the plastic substrate at a temperature range of about 110° C. to about 180° C. Since the plastic substrate expands, the positions of the gate patterns 121, 124, and 124' change, and the distance between two center regions of the neighboring gate electrodes 124 and 124' expands to be L+α. The semiconductor patterns 154 and 154' are then formed by using a semiconductor mask having a distance L+α between two center portions of the semiconductor patterns 154 and 154'. Here, the distance L+α between the two center portions of the semiconductor patterns of the semiconductor patterns is the sum of the original distance L between two center portions of the neighboring gate electrodes and the expanded distance α due to the thermal expansion of the plastic substrate. At this time, the center portions of the gate electrodes 124 and 124' respectively correspond with the center portions of the semiconductor patterns 154 and 154' due to the consideration of the position changes of the gate pattern that results from the thermal expansion, and the correct alignment of the neighboring gate electrodes 124 and 124' and the neighboring semiconductor patterns 154 and 154' are completed. When the coefficient of thermal expansion of the plastic substrate is considered, the expanded distance a due to the thermal expansion is 100 ppm to about 500 ppm.

Figure 6A:
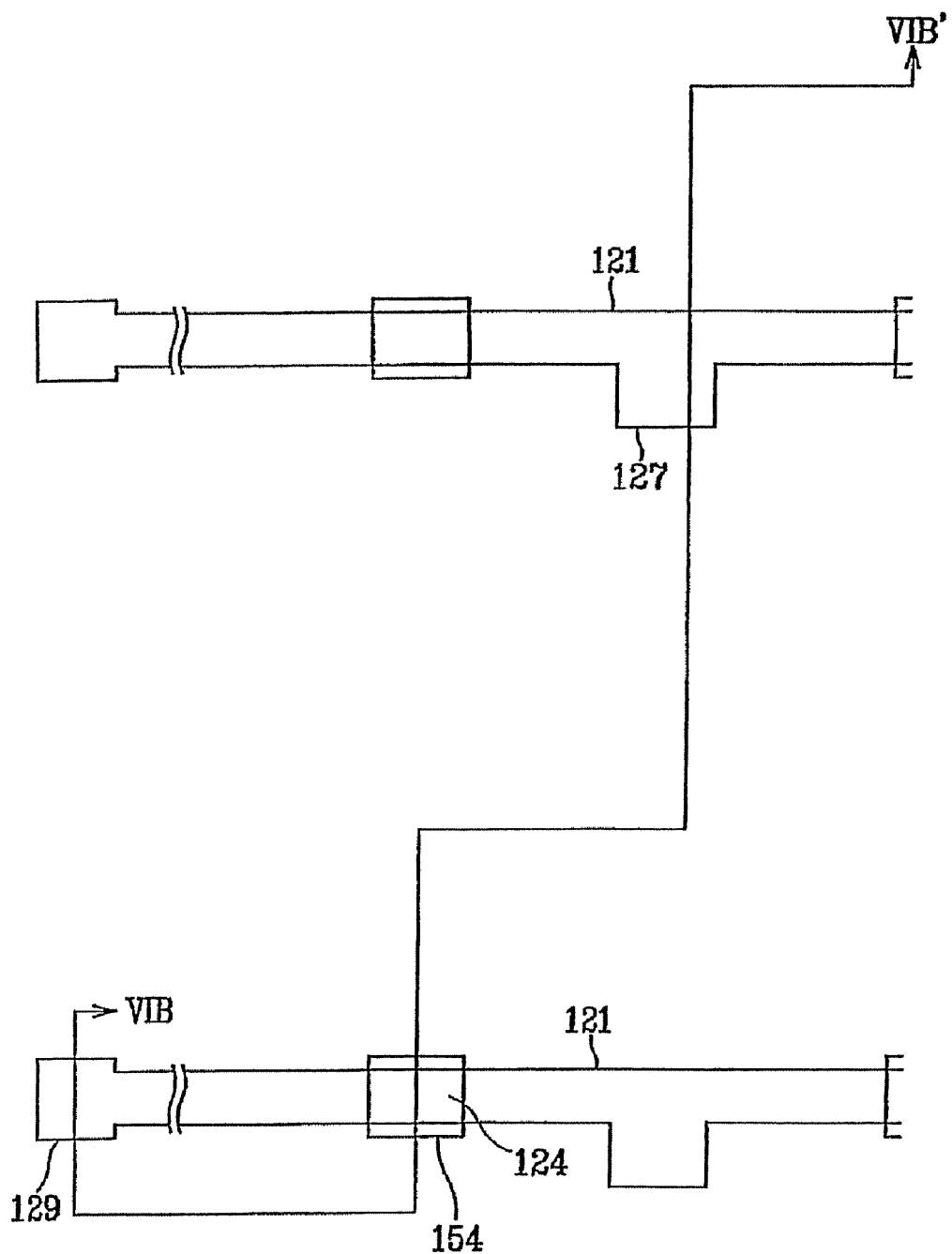
Figure 6B:
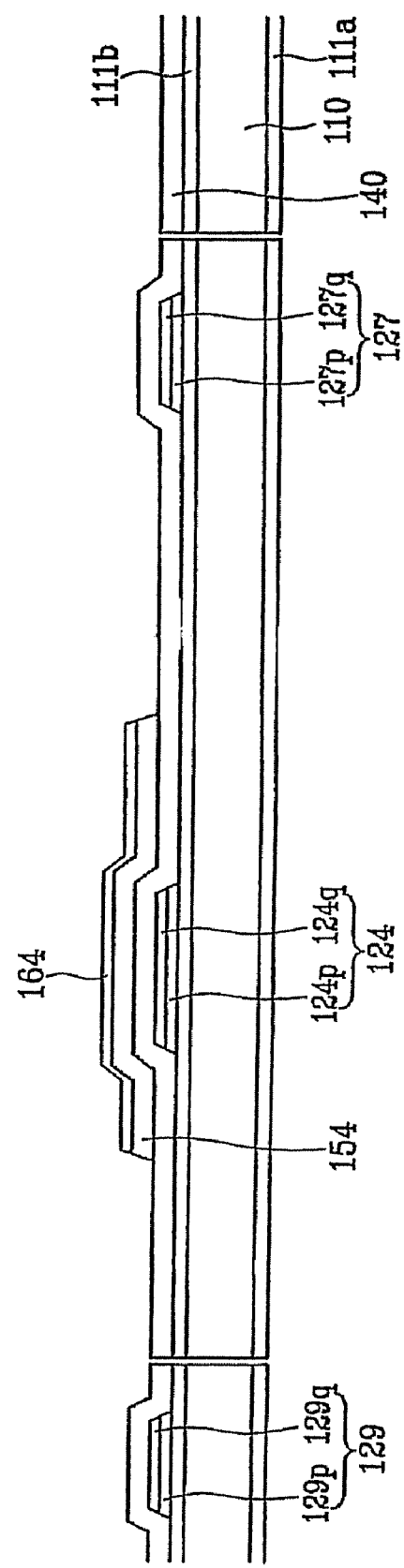
FIG. 6B is a sectional view of the TFT array panel shown in FIG. 6A taken along the line VIB-VIB'.

Hereby, as shown in FIG. 6A and FIG. 6B, the intrinsic a-Si layer 150 and the extrinsic a-Si layer 160 may be photo-etched to form a plurality of intrinsic semiconductor islands 154 and a plurality of extrinsic semiconductor islands 164 at predetermined; e.g., correct positions on the gate electrodes 124.

Figure 7A:
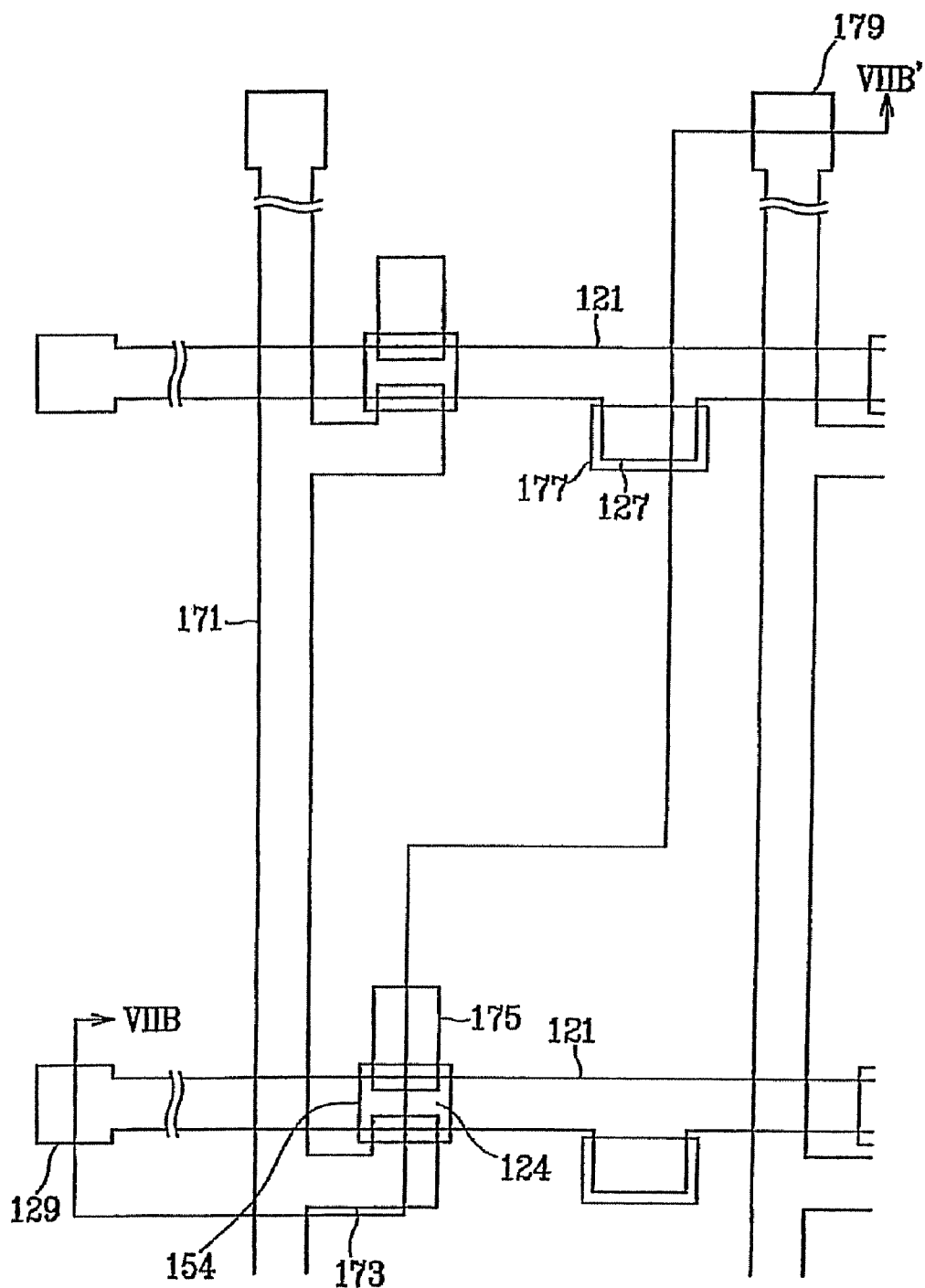
Figure 7B:
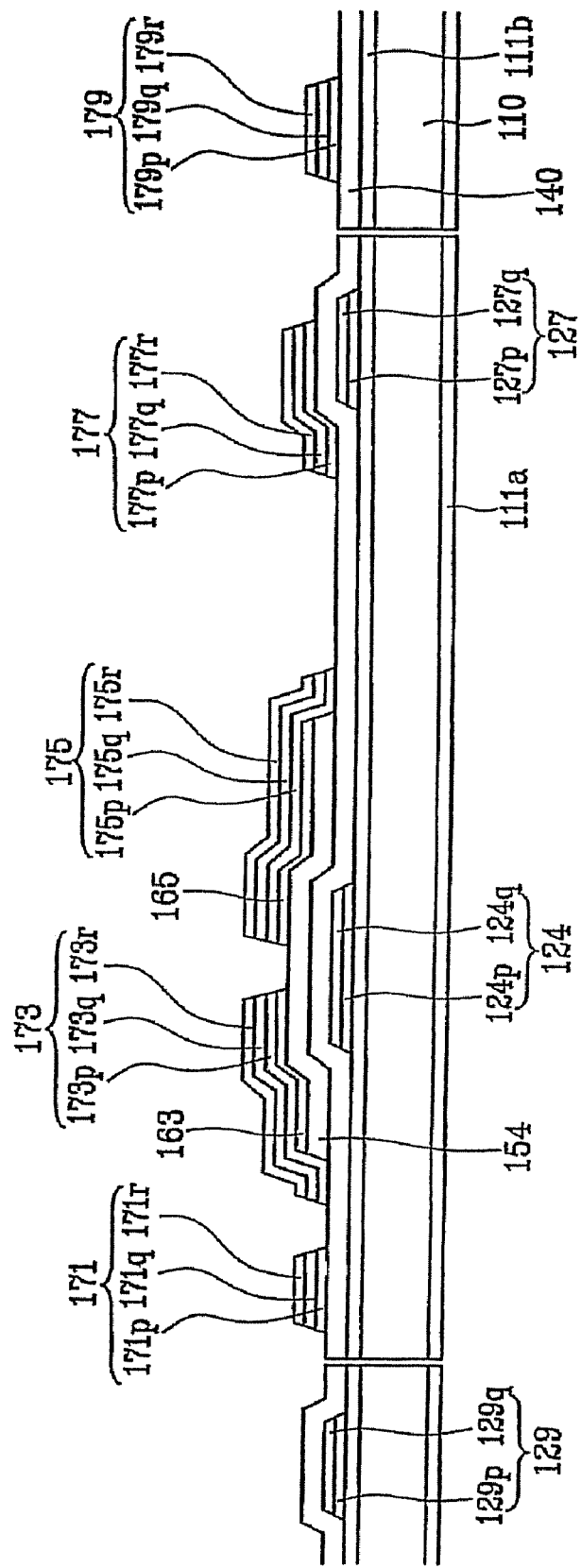
FIG. 7B is a sectional view of the TFT array panel shown in FIG. 7B taken along the line VIIB-VIIB'.

Referring to FIG. 7A and FIG. 7B, a metal film may be sputtered on the extrinsic semiconductor islands 164 and the gate insulating layer 140, and the metal film is etched using a photoresist to form a plurality of data lines 171 that include a plurality of source electrodes 173, a plurality of drain electrodes 175, and a plurality of storage capacitor conductors 177. A first layers 171*p*, 175*p*, and 177*p* containing Mo, second layers 171*q*, 175*q*, and 177*q* containing Al, and third layers 171*r*, 175*r*, and 177*r* containing Mo are sequentially deposited to about 3,000 Å thick, and are photo-etched in the etch condition using one etchant.

Before or after removing the photoresist, portions of the extrinsic semiconductor 164, which are not covered with the data lines 171, the drain electrodes 175, and the storage capacitor conductors 177, are removed by etching to complete a plurality of ohmic contact islands 163 and 165 and to expose portions of the intrinsic semiconductor island 154. Oxygen plasma treatment may follow thereafter to substantially stabilize the exposed surfaces of the semiconductor island 154.

Figure 8A:
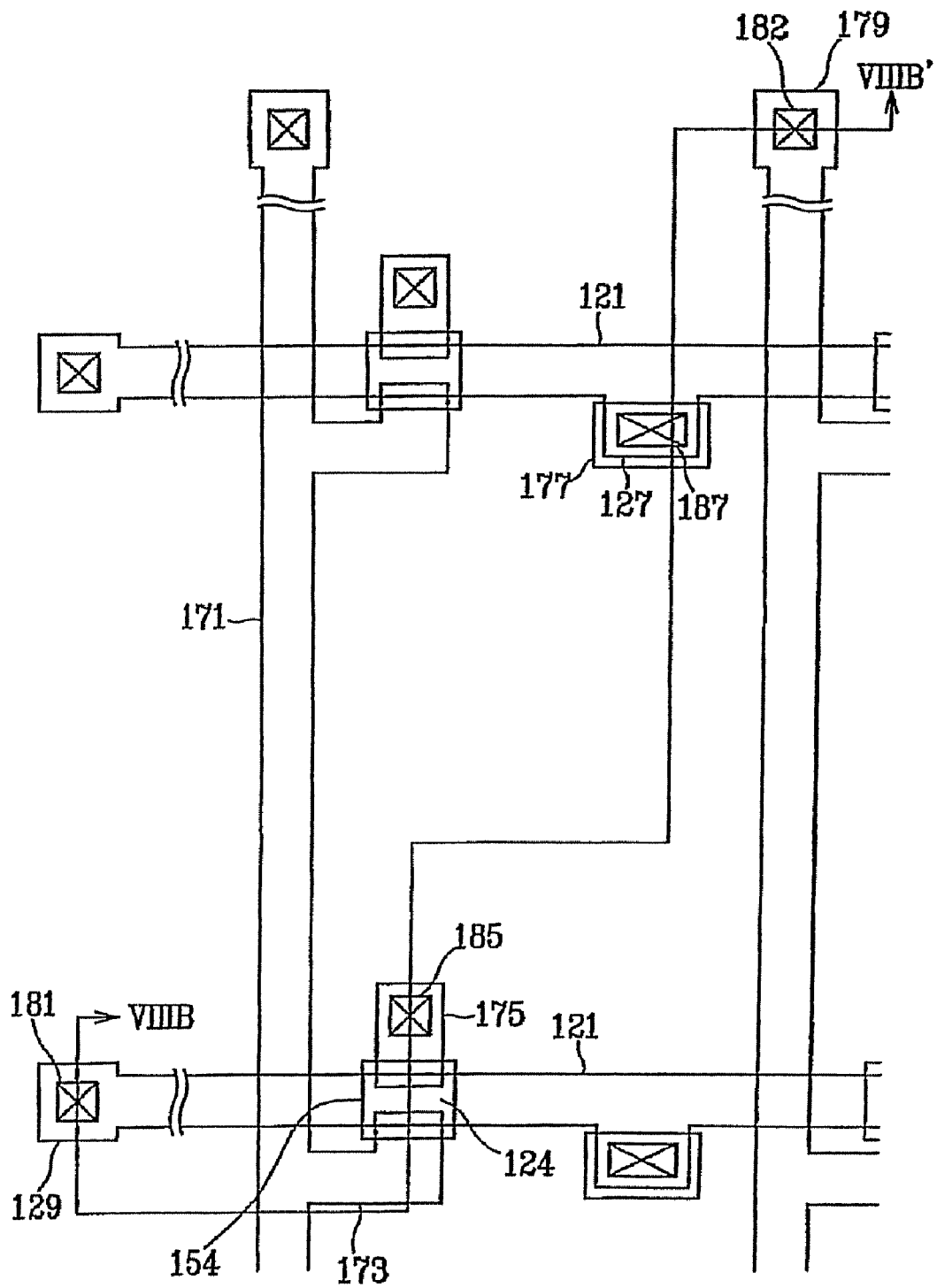
Figure 8B:
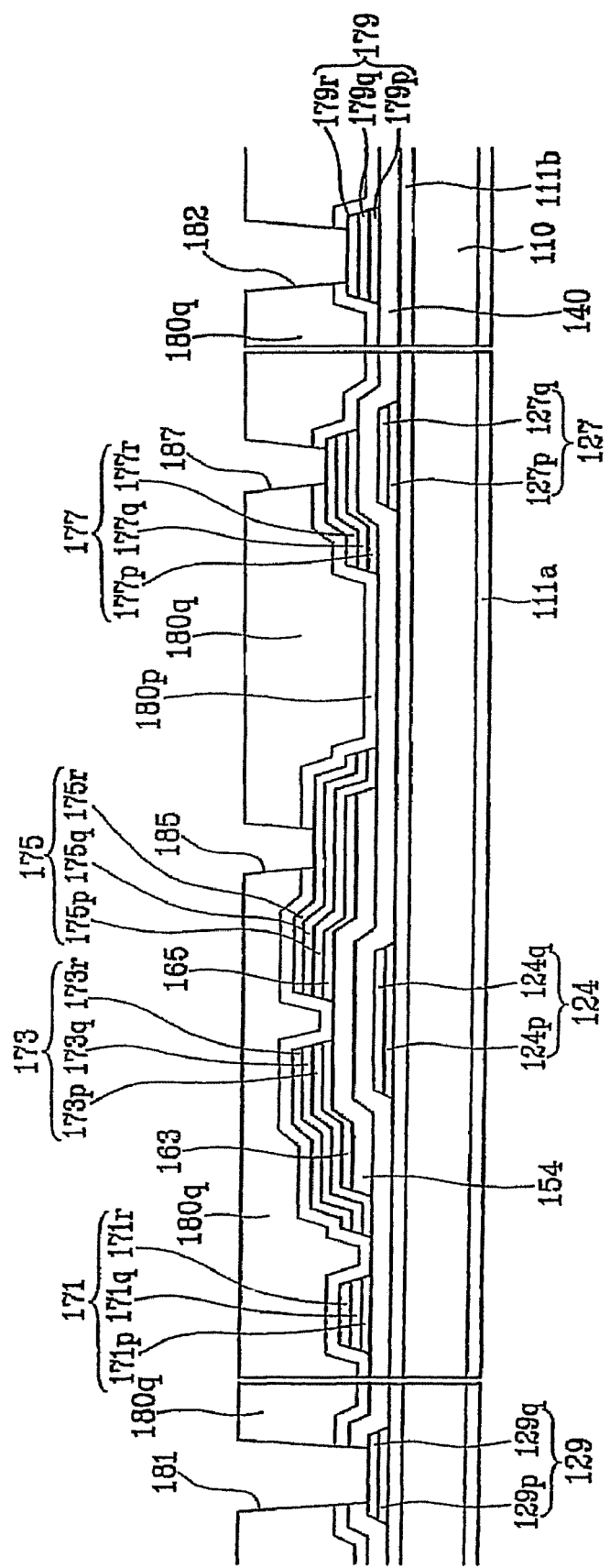
FIG. 8B is a sectional view of the TFT array panel shown in FIG. 8B taken along the line VIIIB-VIIIB'.

Referring to FIG. 8A and FIG. 8B, a lower passivation layer 180*p*, which may be made of an inorganic material such as silicon nitride or silicon oxide, is formed by a plasma enhanced chemical vapor deposition (PECVD) technique, and an upper passivation layer 180*q*, which may be made of a photosensitive organic material such as polyimide, is coated on the lower passivation layer 180*p*. The lower passivation layer 180*p* is about 500 Å to about 2,000 Å thick. The upper passivation layer 180*q* is in the range of about 2 micron to about 3.5 micron thick.

The upper passivation layer 180*q* is then exposed to light through a photo mask and developed to expose the portion of the lower passivation layer 180*p*. The exposed portion of the lower passivation layer 180*p* is dry etched along with the gate insulating layer 140 to form a plurality of contact holes 181, 182, 185, and 187.

Referring to FIG. 1 and FIG. 2, a conductive layer, which may be made of a transparent material such as ITO, IZO, or a-ITO (amorphous indium tin oxide), is deposited by a sputtering technique and is etched using the photoresist to form a plurality of pixel electrodes 190 and a plurality of contact assistants 81 and 82.

The upper passivation layer may be made of an organic material to minimize cross-talk by counterbalancing misalignment between the data lines 171, the drain electrodes 175, the storage capacitor conductors 177, and the pixel electrodes 190.

Figure 9A:
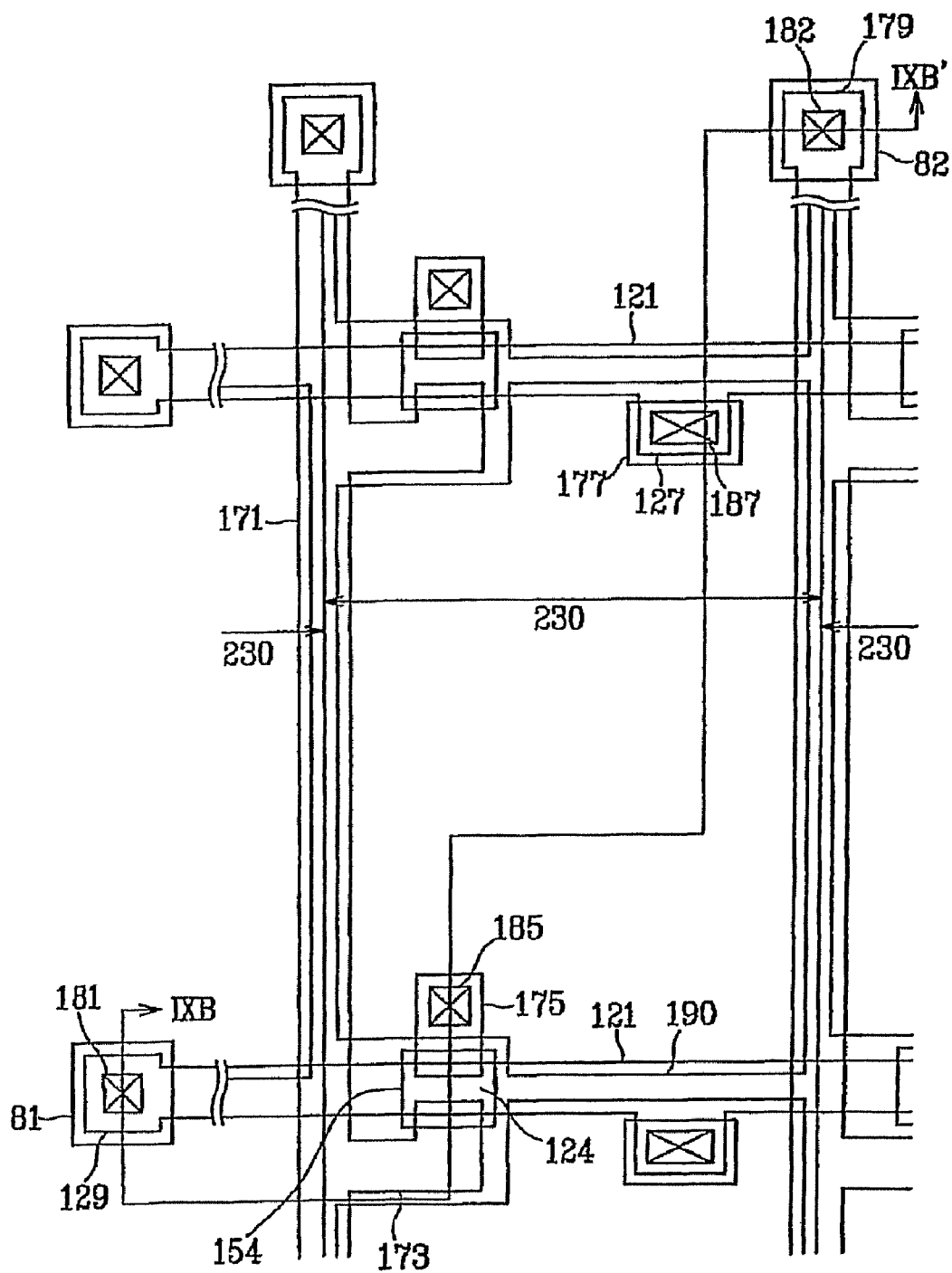
FIGS. 9A, 10A, and 11A are layout views of a TFT array panel for an LCD according to another embodiment of the invention.
Figure 9B:
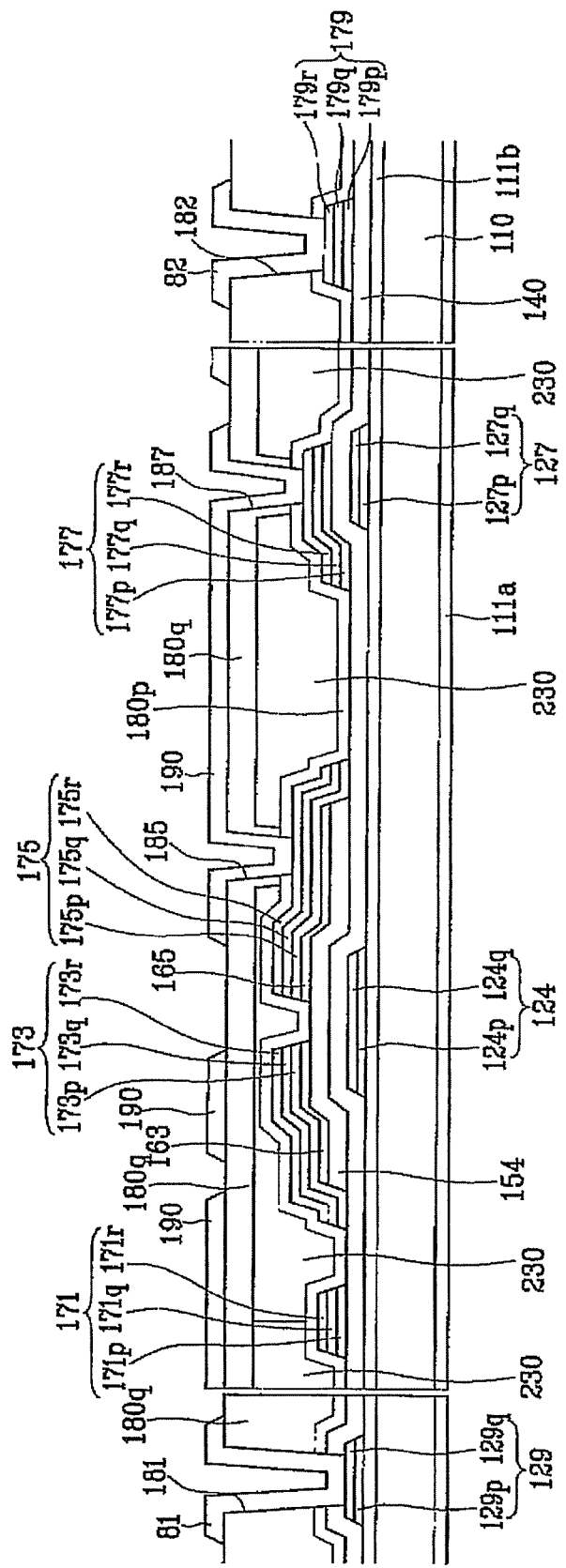
FIG. 9B is a sectional view of the TFT array panel shown in FIG. 9A taken along the lines IXB-IXB'.

FIG. 9A is a layout view of a TFT array panel for an LCD according to another embodiment of the invention. FIG. 9b is a sectional view of the TFT array panel shown in FIG. 9A taken along the lines IXB-IXB'.

Referring to FIG. 9A and FIG. 9B, layered structures of the TFT panels according to this embodiment are substantially the same as those shown in FIG. 1 and FIG. 2.

A plurality of gate lines 121, which include a plurality of gate electrodes 124, a plurality of projections 127, and a plurality of end portions 129, are formed on a substrate 110 of a plastic material. A gate insulating layer 140, a plurality of semiconductor islands 154, and a plurality of ohmic contact islands 163 and 165 are sequentially formed on the substrate 110 having the plurality of gate lines 121. A plurality of data lines 171, which include source electrodes 173 and end portions 179, a plurality of drain electrodes 175, and a plurality of storage capacitor conductors 177, are formed on the ohmic contacts islands 163 and 165, and the gate insulating layer 140, and lower and upper passivation layers 180p and 180q are formed thereon. A plurality of contact holes 181, 182, 185, and 187 are provided at the lower and the upper passivation layers 180p and 180q, and/or the gate insulating layer 140. A plurality of pixel electrodes 190 and a plurality of contact assistants 81 and 82 may be formed on the upper passivation layer 180q.

Different from the TFT array panel shown in FIG. 1 and FIG. 2, a plurality of color filters 230 are provided on the lower passivation layer 180p and an upper passivation layer 180q is formed thereon. The color filters 230 extend substantially along the longitudinal direction along the data lines 171 and are positioned between the data lines 171. The color filters 230 may represent one of the primary colors such as a red color, a green color, and a blue color. The lower passivation layer 180p prevents or substantially prevents the resin of the color filters 230 from polluting the semiconductor islands 154.

The color filters 230 are removed on the peripheral region where the end portions 129 and 179 of the gate and data lines are arranged, and the edge portions of the color filters 230 overlap the data lines 171 to block light leakage between the pixels. The edge portions of the color filters 230 overlapping the data lines 171 may overlap each other and be substantially thinner than the center portions disposed between the data lines 171 to improve the step coverage characteristics of the overlying layer and the flatness of the surface of the panel thereby distorting the alignment of liquid crystal molecules.

The upper passivation layer 180q prevents or significantly prevents the resin of the color filters 230 from polluting the pixel electrodes 190.

The color filters 230 have a plurality of openings 235 and 237 exposing the drain electrode 175 and the storage capacitor conductors 177 along with the lower and upper passivation layers 190a and 190b.

A method for manufacturing the TFT array panel shown in FIG. 9A and FIG. 9B according to another embodiment of the invention is described below in detail with reference to FIGS. 3, 4A, 4B, 5, 6, 10A, 10B, 11A, and 7B.

Figure 10A:
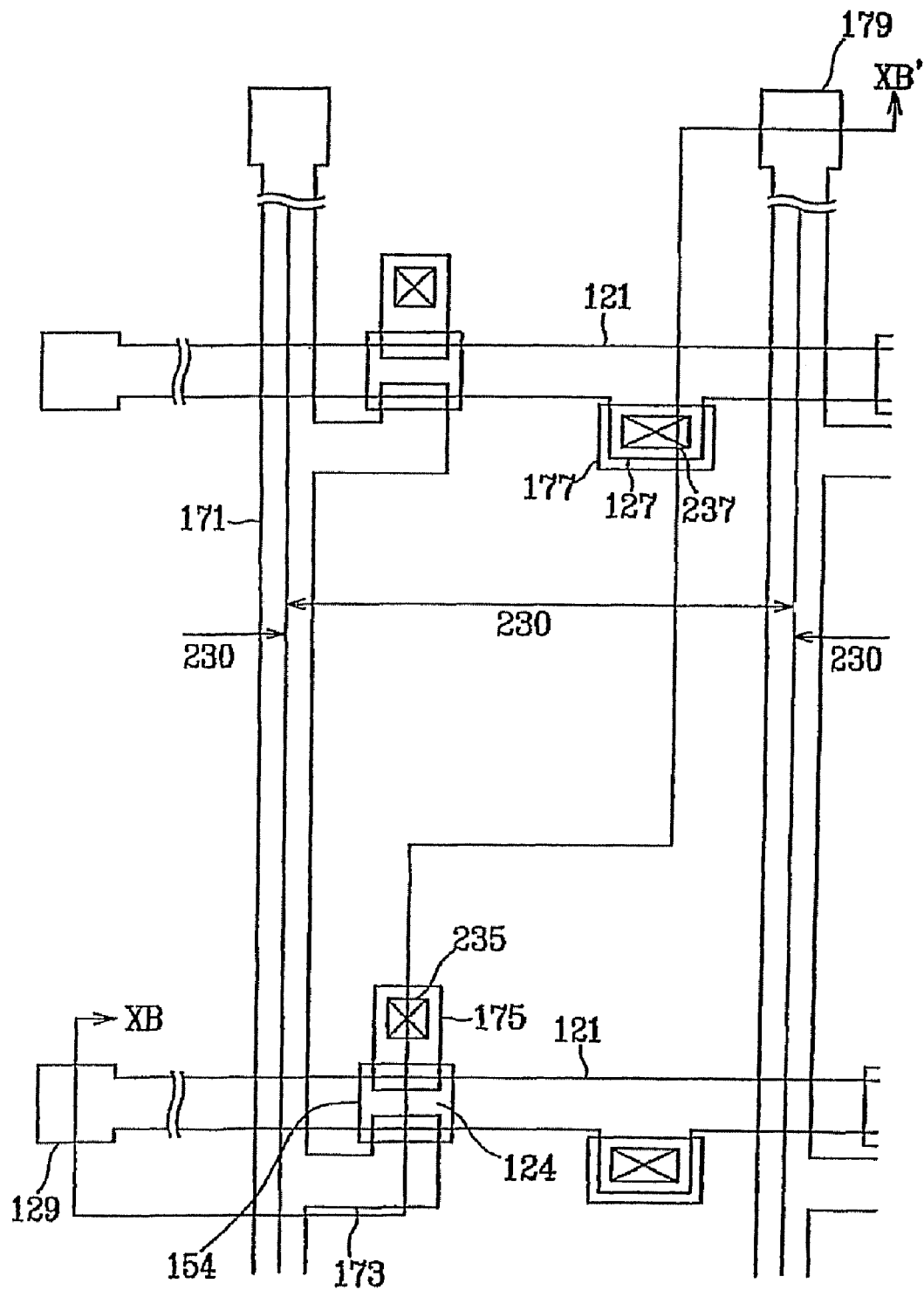
Figure 10B:
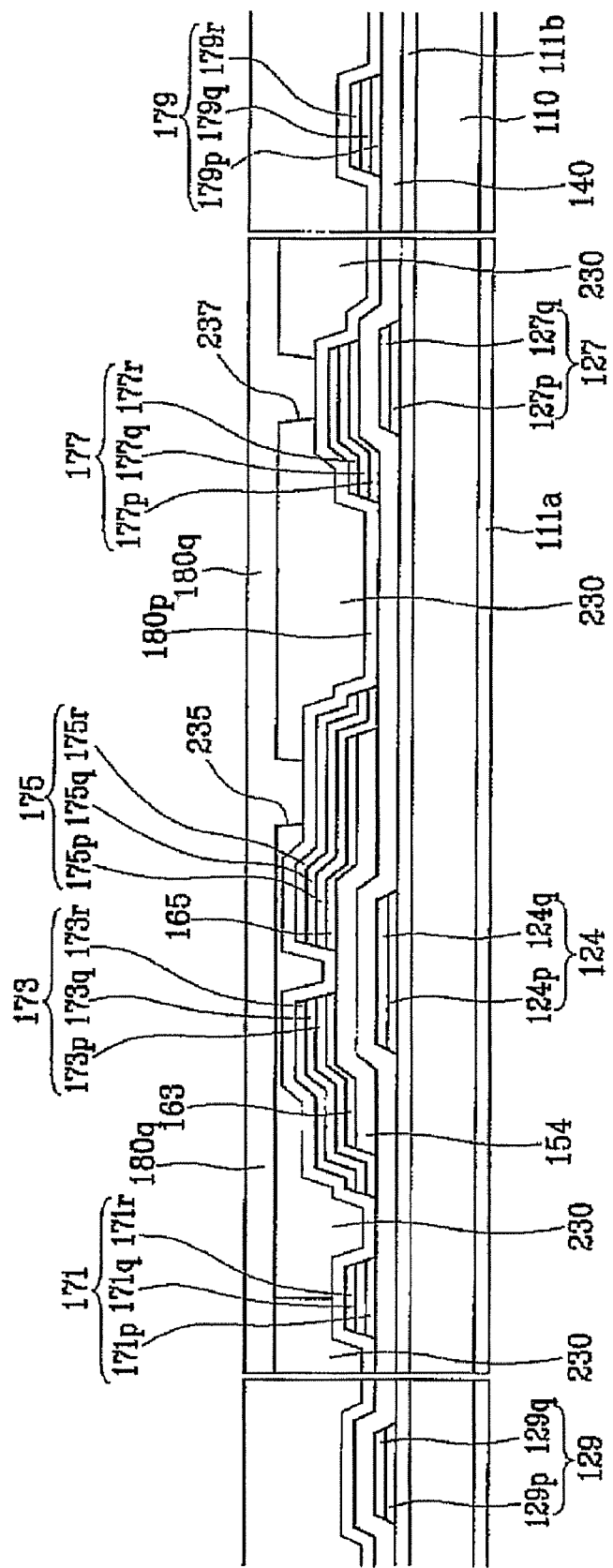
FIG. 10*b* is a sectional view of the TFT array panel shown in FIG. 10A taken along the lines XB-XB'.
Figure 11A:
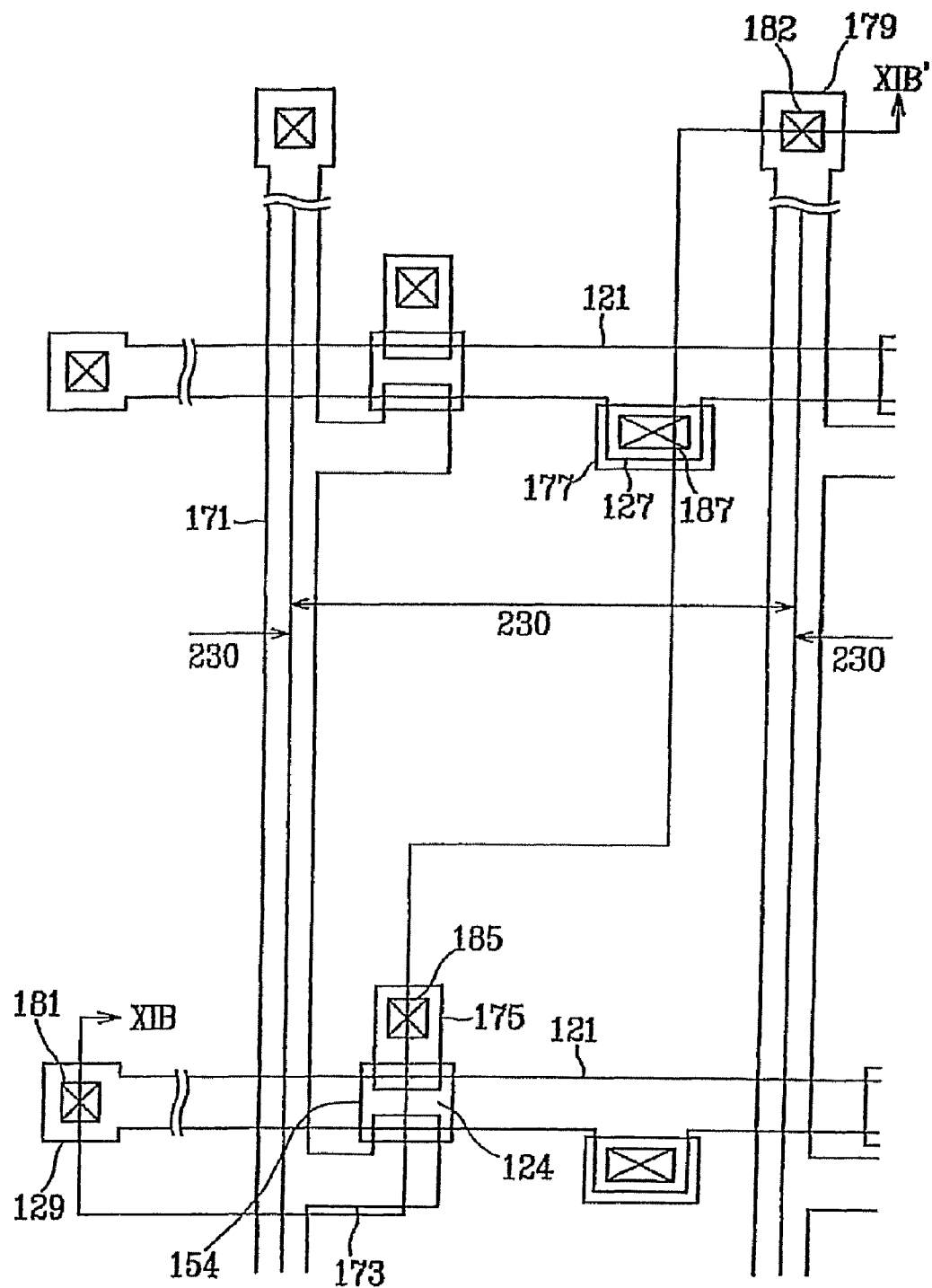
Figure 11B:
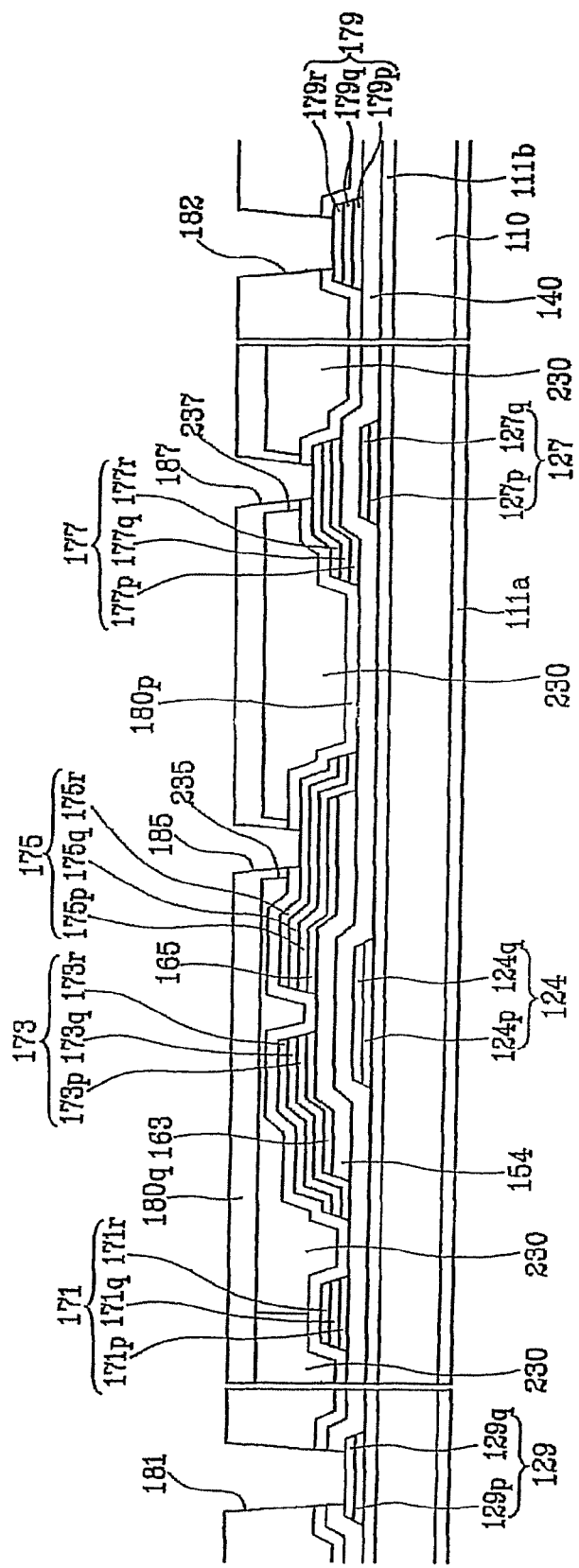
FIG. 11B is a sectional view of the TFT array panel shown in FIG. 11A taken along the lines XI-XIB'.

FIG. 10A and FIG. 11A are layout views of a TFT array panel shown in FIG. 9A and FIG. 9B in intermediate operations of a manufacturing method thereof according to another embodiment of the invention. FIG. 10B is a sectional view of the TFT array panel shown in FIG. 10A taken along the line XB-XB', and FIG. 11B is a sectional view of the TFT array panel shown in FIG. 11A taken along the line XIB-XIB'.

Referring to FIGS. 3, 4A, 4B, 5, 6A, 6B, 7A, and 7B, a plurality of gate lines 121 including a plurality of gate electrodes 124, a plurality of projections 127 and a plurality of end portions 129 are formed on a plastic substrate 110, and a gate insulating layer 140 covering the gate lines 121 is formed.

A plurality of semiconductor islands 154 and a plurality of ohmic contact islands 163 and 165 are then sequentially formed thereon, and a plurality of data lines 171 including source electrodes 173 and end portions 179, a plurality of drain electrodes 175, and a plurality of storage capacitor conductors 177 are formed thereon.

Referring to FIG. 10A and FIG. 10B, a lower passivation layer 180p, which may be made of an inorganic material such as silicon nitride or silicon oxide, is formed by a plasma enhanced chemical vapor deposition (PECVD).

A plurality of color filters 230 are then formed on the lower passivation layer 180p. The color filters 230 may be formed, for example, by sequentially coating, light-exposing, and developing a negative photosensitive organic material including a red color, a green color, and a blue color pigments, respectively. At this time, a plurality of openings 235 and 237 exposing the portions of the lower passivation 180p on the drain electrodes 175 and the storage capacitor conductors 177 are formed in the color filters 230.

Next, an upper passivation layer 180q, which may be made of a photosensitive organic material such as polyimide is coated on the lower passivation layer 180p.

The upper and lower passivation layers 180p and 180q are then dry etched along with the gate insulating layer 140 to form a plurality of contact holes 181, 182, 185, and 187.

Referring to FIG. 9A and FIG. 9B, a conductive layer is deposited by sputtering and is etched using the photoresist to form a plurality of pixel electrodes 190 and a plurality of contact assistants 81 and 82.

As above-described, a misalignment between the upper patterns and the under patterns may be minimized on the substrate of a plastic material by patterning the photo mask, the pattern having intervals with consideration of the coefficient of thermal expansion.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of forming thin film patterns, the method comprising:

forming a first layer on a substrate, the first layer comprising a plurality of first film members with a first interval provided between adjacent first film members; and forming a second layer on the substrate provided with the first layer, the second layer comprising a plurality of second film members with a second interval provided between adjacent second film members, the second interval being different from the first interval corresponding to a coefficient of thermal expansion of the substrate on which the first layer and the second layer are formed.

2. The method of claim 1, wherein a length of the second interval is equal to a sum of a length of the first interval and an expanded interval corresponding to the coefficient of thermal expansion of the substrate.

3. The method of claim 1, wherein the second interval is about 100 ppm to about 500 ppm larger than the first interval.

4. The method of claim 1, wherein an interval between adjacent first film members after forming the second layer is substantially equal to the second interval.

5. The method of claim 1, wherein at least one of the first layer and the second layer comprises a conductive material.

6. The method of claim 1, wherein at least one of the first layer and the second layer comprises a semiconductor material.

7. The method of claim 1, wherein the substrate is a flexible substrate.

8. The method of claim 1, further comprising:
forming a third layer on the substrate provided with the first layer before forming the second layer.

9. The method of claim 8, wherein the third layer comprises an insulating material.

10. A method of forming thin film patterns on a substrate, the method comprising:
forming a plurality of first thin film members using a first mask having a predetermined distance between center portions of adjacent first thin film members to be formed on the substrate;
depositing a thin film on the substrate; and
forming a plurality of adjacent second thin film members by using a second mask being spaced apart from each other at a distance that is equal the predetermined distance plus a distance relating to the coefficient of thermal expansion of the substrate on which the first thin film members and the second thin film members are formed,
wherein center portions of the adjacent first thin film members correspond with center portions of the adjacent second thin film members due to the thermal expansion.

11. The method of claim 10, wherein the substrate is plastic and a thermal expansion of the substrate is between about 100 ppm to about 500 ppm.

12. A method of forming thin film patterns, the method comprising:
forming a first layer on a substrate, the first layer comprising a plurality of first film members spaced apart from each other by a first distance;
changing the distance between the first film members on the substrate from the first distance into a second distance; and
forming a second layer on the substrate provided with the first layer, the second layer comprising a plurality of second film members spaced apart from each other by a distance substantially equal to the second distance,
wherein the change of the distance and the formation of the second layer are simultaneously performed.

13. The method of claim 12, wherein the change of the distance comprises:
varying the temperature of the substrate.

14. The method of claim 13, wherein the formation of the second layer comprises:
depositing a thin film; and
patterning the thin film to form the plurality of second film members.

15. The method of claim 14, wherein the change of the distance and the deposition of the thin film are simultaneously performed.

16. The method of claim 13, further comprising:
depositing a thin film on the substrate provided with the first layer before forming the second layer.

17. The method of claim 16, wherein the change of the distance and the deposition of the thin film are simultaneously performed.

18. The method of claim 13, wherein the formation of the first layer is performed by photolithography with a first mask having a plurality of first patterns corresponding to the first film members,
the formation of the second layer is performed by photolithography with a second mask having a plurality of second patterns corresponding to the second film members,
a distance between the first patterns is substantially equal to the first distance, and
a distance between the second patterns is substantially equal to the second distance.

19. The method of claim 13, wherein the substrate is a flexible substrate.

* * * * *